US007222279B2

United States Patent
Tanimura

(10) Patent No.: US 7,222,279 B2
(45) Date of Patent: May 22, 2007

(54) SEMICONDUCTOR INTEGRATED CIRCUIT AND TEST SYSTEM FOR TESTING THE SAME

(75) Inventor: Masaaki Tanimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 414 days.

(21) Appl. No.: 10/426,663

(22) Filed: May 1, 2003

(65) Prior Publication Data

US 2004/0143782 A1 Jul. 22, 2004

(30) Foreign Application Priority Data

Jan. 17, 2003 (JP) .............................. 2003-009704

(51) Int. Cl.
*G01R 31/3193* (2006.01)
*G01R 31/316* (2006.01)
(52) U.S. Cl. ...................................... 714/735; 714/718
(58) Field of Classification Search ................ 714/735, 714/736, 738, 718, 54, 42, 43, 763, 25, 702, 714/719; 365/200, 201
See application file for complete search history.

(56) References Cited

U.S. PATENT DOCUMENTS 5,072,138 A 12/1991 Slemmer et al.
6,470,467 B2 10/2002 Tomishima et al.
2001/0022743 A1 * 9/2001 Sato et al. ............. 365/189.03
2003/0016045 A1 1/2003 Tanimura et al.
2003/0057940 A1 3/2003 Tanimura

FOREIGN PATENT DOCUMENTS

| JP | 4-169870 | 6/1992 |
|---|---|---|
| JP | 06-148279 | 5/1994 |
| JP | 10-90353 | 4/1998 |
| JP | 2000-163991 | 6/2000 |
| JP | 2001-297598 | 10/2001 |
| JP | 2002-107419 | 4/2002 |

* cited by examiner

*Primary Examiner*—Guy Lamarre
*Assistant Examiner*—Dipakkumar Gandhi
(74) *Attorney, Agent, or Firm*—McDermott Will & Emery LLP

(57) ABSTRACT

A semiconductor integrated circuit includes a pin section, internal circuits, an interface section, an expectation value generation circuit, a comparison circuit and a waveform generation circuit. In a first test mode, the expectation value generation circuit generates expectation values of operation signals to be generated by the interface section when first test signals having the same waveform are input via respective pins of the pin section, and the comparison circuit compares operation signals that are actually produced by the interface section with the respective expectation values and produces comparison results. In a second test mode, the waveform generation circuit supplies second test signals to the interface section, and the interface section outputs test output signals having the same waveform to the external system via respective pins of the pin section.

4 Claims, 5 Drawing Sheets

SEMICONDUCTOR INTEGRATED CIRCUIT AND TEST SYSTEM FOR TESTING THE SAME

BACKGROUND OF THE INVENTION

1. Field of the Invention

The present invention relates to a semiconductor integrated circuit whose interface section is tested and a test system for testing the semiconductor integrated circuit.

2. Background Art

A semiconductor integrated circuit has a pin section and an interface section in addition to internal circuits. The interface section generates operation signals for causing operation of the internal circuits by decoding and amplifying input signals that are input via the pin section, and outputs, to an outside, via the pin section, data that are read from the internal circuits.

With the increase in arithmetic processing speed, recent semiconductor integrated circuits are required to operate at a high speed in responding to signals that are input from an external circuit. Particularly, in semiconductor integrated circuits that operate in synchronism with an external clock, an operation frequency has increased steadily. Input/output specification values of the interface section such as a setup time, a hold time, and an access time between an external clock and each control signal have become increasingly small.

With the above tendency, in test systems for testing whether or not the timing of a signal that is input to or output from the interface section via each pin is normal, it is important to adjust, with high accuracy, timing deviations (skews) of test signals that are input or output between a test apparatus and the semiconductor integrated circuit to decrease the skews (de-skewing). For example, where a setup time should be shorter than several hundreds of picoseconds in a product specification, to enable a correct test, the test system should have skew accuracy of several tens of picoseconds or less.

A test on the interface section is performed for a semiconductor integrated circuit for which it has been confirmed in advance with slow timing that logic operations are performed normally. First, in pin electronics of the test apparatus, a common reference comparator compares and checks a waveform format and timing for each pin of the pin section of a device to be tested. Then, on the basis of detection results, de-skewing is performed by finely adjusting variable delay circuits in a timing generator and the pin electronics of the test apparatus, whereby a setup time, a hold time, and an access time are set strictly. Then, the semiconductor integrated circuit as the device to be tested is caused to operate with the same logic scheme as in ordinary operation and with proper input timing and whether the device to be tested operates normally is judged on the basis of its response results.

A test system is composed of a general-purpose test apparatus and a dedicated board on which a device to be tested in to be mounted. The dedicated board complies with the specification of the device to be tested. Various kinds of devices can be tested by exchanging dedicated boards. Devices to be tested are interchanged automatically by a handler. Therefore, the test apparatus and the device to be tested are distant from each other and are connected to each other by coaxial cables or wiring patterns on a circuit board. In this case, designing has been made so that impedance matching is attained between all the related terminals and lines, that is, between driver outputs of the pin electronics and the wiring patterns or coaxial cables. The test apparatus is provided with complex adjustment mechanisms that are necessary for adjustment of timing errors of the order of tens of picoseconds.

In an actual test, whether the interface section operates normally is judged on the basis of response results of internal operation of a device to be tested. Therefore, the waveform format and the timing vary from one pin to another. However, de-skewing is performed by using typical conditions, that is, conditions of a certain waveform format, timing, etc. Therefore, in an actual test, there is a possibility that a subtle timing error occurs in a signal at each terminal of a device to be tested.

As compared with this, in de-skewing and an actual test, the accuracy of timing can be kept high by giving the same waveform to all signals including a reference clock. However, ordinary devices to be tested are inoperative in such a condition.

Additionally, coaxial cables etc. have errors in impedance. Therefore, if a test apparatus and a device to be tested are distant from each other and long wiring is used to connect those, there may occur disturbances between signal propagation delays and waveform disorders, which are factors of lowering the accuracy of timing. As a result, there is a possibility that a signal has a subtle timing error at each terminal of the device to be tested even if de-skewing is performed in the test apparatus.

One measure for solving the above problem is a method that an auxiliary test apparatus is used to enable timing adjustments in the vicinity of a device to be tested. However, the circuits of such an auxiliary test apparatus should be complex to accommodate various kinds of waveform formats and timing.

SUMMARY OF THE INVENTION

According to one aspect of the present invention, a semiconductor integrated circuit comprises a pin section having a plurality of pins, internal circuits, an interface section, an expectation value generation circuit, a comparison circuit and a waveform generation circuit. The interface section produces operation signals for causing operation of the internal circuits at the time of receiving signals from an external system via the pin section, and outputs, to the external system, via the pin section, data that are read from the internal circuits. In a first test mode, the expectation value generation circuit generates expectation values of operation signals to be generated by the interface section when first test signals having the same waveform are input via respective pins of the pin section, and the comparison circuit compares operation signals that are actually produced by the interface section with the respective expectation values and produces comparison results. In a second test mode, the waveform generation circuit supplies second test signals to the interface section, and the interface section outputs test output signals having the same waveform to the external system via respective pins of the pin section.

Other and further objects, features and advantages of the invention will appear more fully from the following description.

DETAILED DESCRIPTION OF THE PREFERRED EMBODIMENTS

First Embodiment

Figure 1:
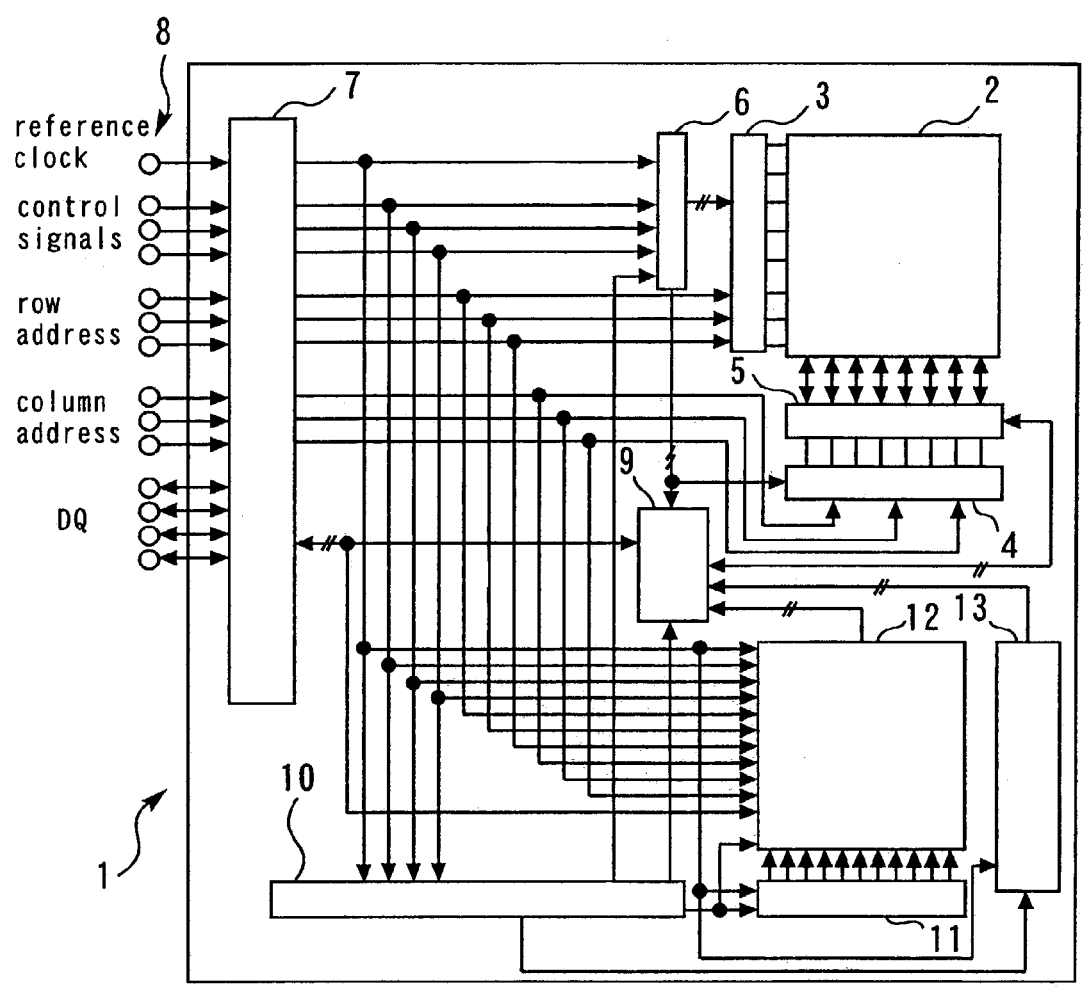
FIG. 1 shows a configuration of a semiconductor integrated circuit according to a first embodiment of the present invention.

FIG. 1 shows a configuration of a semiconductor integrated circuit according to a first embodiment of the present invention. The semiconductor integrated circuit 1 has, as internal circuits, a memory array 2, a row decoder 3, a column decoder 4, a sense amplifier 5, and a control circuit 6. The semiconductor integrated circuit 1 also has an interface section 7, a pin section 8 having a plurality of pins, a latch circuit 9, a test mode selection circuit 10, an expectation value generation circuit 11, a comparison circuit 12, and a waveform generation circuit 13.

Ordinary operation of the semiconductor integrated circuit 1 will be described below. First, signals are input externally to the interface section 7 via the pin section 8. The input signals are a reference clock, control signals, a row address, a column address, and a DQ (data input/output) signal. On the basis of these signals, the interface section 7 produces operation signals for causing operation of the internal circuits.

Operation signals corresponding to the reference clock and the control signals are supplied to the control circuit 6. And the control circuit 6 controls the row decoder 3, the column decoder 4, and the latch circuit 9. Operation signals corresponding to the row address and the column address are supplied to the row decoder 3 and the column decoder 4, respectively. An operation signal corresponding to the DQ signal is supplied to the memory array 2 via the interface section 7, the latch circuit 9, and the sense amplifier 5.

The operation signals corresponding to the reference clock and the control signals are also supplied to the test mode selection circuit 10. The test mode selection circuit 10 produces a first activation signal for activating the expectation value generation circuit 11 and the comparison circuit 12 in a first test mode, and produces a second activation signal for activating the waveform generation circuit 13 in a second test mode. Since this description is directed to the ordinary operation, the test mode selection circuit 10 produces neither the first activation signal nor the second activation signal and hence none of the expectation value generation circuit 11, the comparison circuit 12, and the waveform generation circuit 13 are activated.

Then, the interface section 7 reads data from the memory array 2 (internal circuit) via the sense amplifier 5 and the latch circuit 9 and outputs, as a DQ signal, the read-out data to the outside via the pin section 8.

Next, the first test mode will be described which is a mode for an input test on the interface section 7. Whether the timing of operation signals that are produced by the interface section 7 in response to external signals is normal is checked on a pin-by-pin basis.

Figure 2:
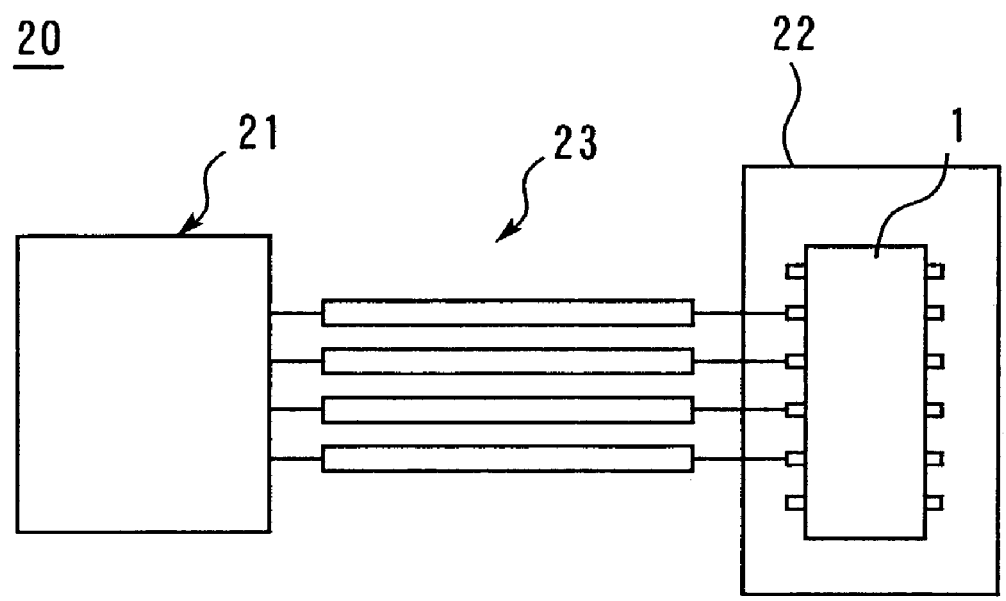
FIG. 2 shows a test system according to a first embodiment of the present invention.

First, the semiconductor integrated circuit 1 is set in a test system 20 as shown in FIG. 2. The test system 20 has a test apparatus 21 and a circuit board 22 on which the semiconductor integrated circuit 1 is mounted. The circuit board 22 is provided on one of dedicated boards that are exchanged for respective devices to be tested, and semiconductor integrated circuits 1 as devices to be tested are interchanged automatically by a handler. Therefore, the circuit board 22 and the test apparatus 21 are distant from each other. The semiconductor integrated circuit 1 and the test apparatus 21 are connected to each other by coaxial cables 23.

Figures 3A, 3B:
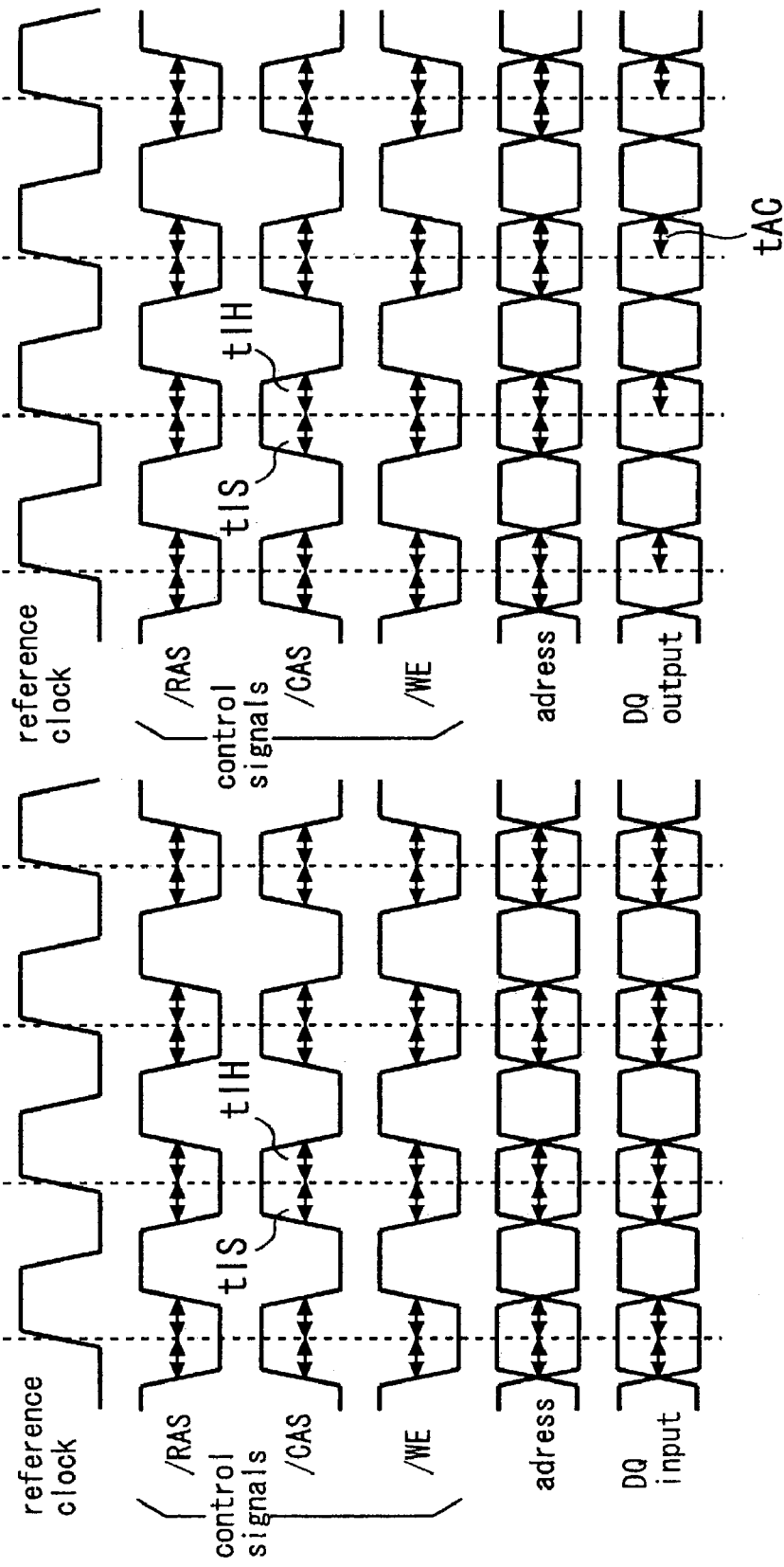
FIG. 3 shows signals that are used when a DQ signal is input from the test apparatus to the semiconductor integrated circuit and signals that are used when the DQ signal is output from the semiconductor integrated circuit to the test apparatus.

In the test system 20, de-skewing has been performed in advance between the semiconductor integrated circuit 1 and the test apparatus 21 by using signals having the same waveform as shown in FIGS. 3A and 3B. FIG. 3A shows signals that are used when a DQ signal is input from the test apparatus 21 to the semiconductor integrated circuit 1. FIG. 3B shows signals that are used when the DQ signal is output from the semiconductor integrated circuit 1 to the test apparatus 21. The signals having the same waveform as shown in FIGS. 3A and 3B are input or output via pins via which control signals (/RAS (row address strobe), /CAS (column address strobe), and /WE (write enable)), addresses, and a DQ are input or output. For these signals, a setup time (tIS), a hold time (tIH), output judgment timing (tAC) are set so as to establish synchronization with rises of a reference clock.

Then, signals having the same waveform are input, as first test signals, to the pin section 8 from the external test apparatus 21 via the respective pins in the same manner as in the de-skewing. Then, the interface section 7 produces operation signals corresponding to the first test signals. The operation signals are supplied to the test mode selection circuit 10 and the test mode selection circuit 10 selects the first test mode. The test mode selection circuit 10 produces a first activation signal, whereby the expectation value output circuit 11 and the comparison circuit 12 are activated. The waveform generation circuit 13 is not activated in the first test mode.

The expectation value output circuit 11 generates operation signal expectation values that would be output from the interface section 7 in response to the first test signals if the interface section 7 is normal. The comparison circuit 12 compares the timing of operation signals that are actually output from the interface circuit 7 with that of the expectation values that are generated by the expectation value output circuit 11, and outputs comparison results. The comparison results are latched by the latch circuit 9 and then are output to the external test apparatus 21 via the interface section 7 and the pin section 8.

Next, a second test mode will be described. In the second test mode which is a mode for an output test on the interface section 7, whether the timing of output signals that are output to the outside from inside the semiconductor integrated circuit 1 via the interface section 7 is normal is checked on a pin-by-pin basis.

First, a signal containing an instruction to select the second test mode is supplied from the external test apparatus 21 to the test mode selection circuit 10 via the pin section 8 and the interface section 7. The test mode selection circuit 10 produces a second activation signal, whereby the waveform generation circuit 13 is activated. The expectation value generation circuit 11 and the comparison circuit 12 are not activated in the second test mode.

The waveform generation circuit 13 generates second test signals and supplies those to the interface section 7 via the latch circuit 9. The second test signals are fixed data of pre-selected "H" or "L" or have a repetition pattern of "H" and "L." The interface section 7 outputs, to the outside, via the pin section 8, test output signals in response to the second test signals. Like the signals that were used in the de-skewing, the test output signals that are output from the respective pins of the pin section 8 have the same waveform as shown in FIGS. 3A and 3B. In the case of the second test mode, the latch circuit 9 is controlled so that any data are not output from the internal circuits to the interface section 7. Then, the external test apparatus 21 checks, on a pin-by-pin basis, whether the timing of the test output signals that are output from the interface section 7 is normal.

With the above configuration, first test signals that are input from the external test apparatus 21 to the semiconductor integrated circuit 1 can be given the same waveform. Test output signals that are output from the semiconductor integrated circuit 1 to the test apparatus 21 can also be given the same waveform. Thereby, signals that are exchanged in a test between the semiconductor integrated circuit 1 and the test apparatus 21 via the respective pins of the pin section 8 can be given the same waveform. Therefore, as long as pre-test de-skewing is performed by using signals which have the same waveform like the above signals, high accuracy of timing can be kept also in a test.

In each of the first test mode and the second test mode, the internal circuits do not perform their ordinary operation. However, if the internal circuit did not operate, a test would not involve any power source and ground noises that may occur during ordinary operation when the power consumption is high. In view of this, in each of the first test mode and the second test mode, the internal circuits are caused to perform random operation automatically by supplying a signal from the test mode selection circuit 10 to the control circuit 6 in a state that the internal circuits are disconnected from the interface circuit 7. This makes it possible to perform a more correct test on the interface circuit 7. Although the first embodiment is directed to the semiconductor integrated circuit 1 that enables tests in both of the first test mode and the second test mode, the invention can also be applied to a semiconductor integrated circuit that is subjected to only one of those tests.

Second Embodiment

Figure 4:
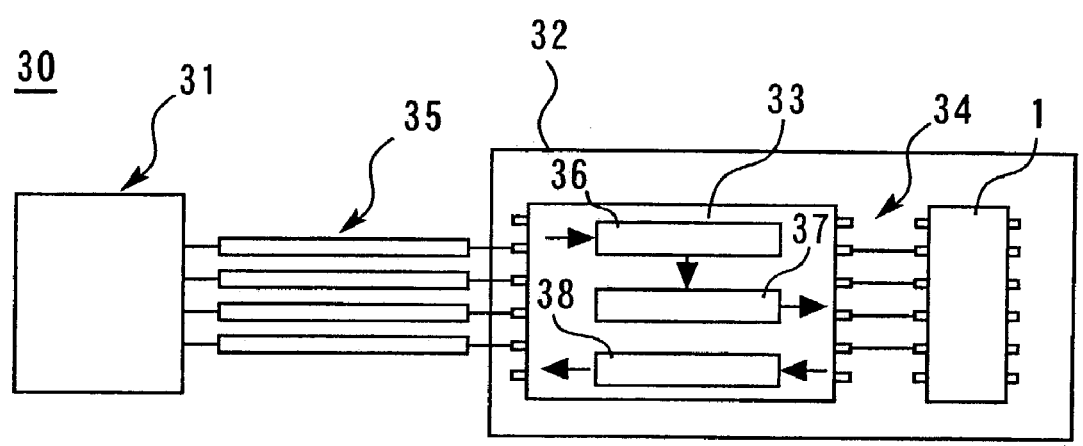
FIG. 4 shows a test system according to a second embodiment of the present invention.

FIG. 4 shows a test system according to a second embodiment of the present invention. A test system 30 has a test apparatus 31, a circuit board 32 on which the semiconductor integrated circuit 1 is mounted, and a test assisting device 33 that is provided on a circuit board 32 in the vicinity of a mounting portion for the semiconductor integrated circuit 1. The semiconductor integrated circuit 1 and the test assisting device 33 that are placed on the same circuit board 32 are connected to each other by wiring patterns 34. The circuit board 32 is distant from the test apparatus 21, and the test apparatus 31 and the test assisting device 33 are connected to each other by coaxial cables 35. As such, in the test system 30, the test apparatus 21 and the semiconductor integrated circuit 1 have a first path for connecting those via the test assisting device 33.

The test assisting device 33 has a latch circuit 36, a delay circuit 37, and a comparative judgment circuit 38. The latch circuit 36 and the delay circuit 37 constitute timing adjusting means for performing, on a pin-by-pin basis, timing adjustments on first test signals that are supplied from the test apparatus 31 via the pin section 8. The comparative judgment circuit 38 performs, on a pin-by-pin basis, comparative judgment on test output signals that are output from the pin section 8 of the semiconductor integrated circuit 1. That is, the comparative judgment circuit 38 checks, on a pin-by-pin basis, whether the timing of each signal of the test output signals is normal. Judgment results are output to the test apparatus 31.

Providing such a test assisting device 33 makes it possible to perform timing adjustments on first test signals in the vicinity of the semiconductor integrated circuit 1. Further, comparative judgment on test output signals can be performed in the vicinity of the semiconductor integrated circuit 1, that is, before timing deviations are caused by a transmission system such as the coaxial cables 35. This makes it possible to test the interface section 7 with higher accuracy of timing. Furthermore, since first test signals and test output signals that are input or output via the respective pins have the same waveform, the circuit configuration of the test assisting circuit 33 can be simplified.

Third Embodiment

Figure 5:
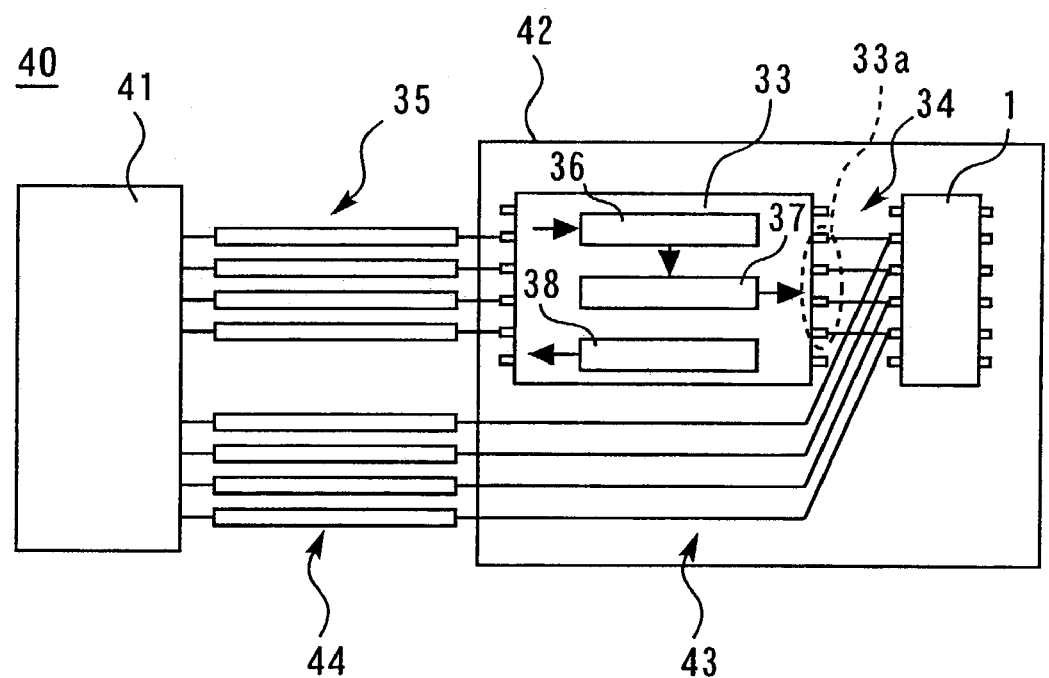
FIG. 5 shows a test system according to a third embodiment of the present invention.

FIG. 5 shows a test system according to a third embodiment of the present invention. Components in FIG. 5 having the same components in FIG. 4 are given the same reference numerals as the latter and will not be described. As in the case of the second embodiment, a test system 40 has a test apparatus 41, a circuit board 42 on which the semiconductor integrated circuit 1 is mounted, and a test assisting device 33 that is provided on the circuit board 42 in the vicinity of a mounting portion for the semiconductor integrated circuit 1. The test system 40 also has a second path for connecting the test apparatus 31 and the semiconductor integrated circuit 1 without any intervention of the test assisting device 33. The second path consists of wiring patterns 43 on the circuit board 42 that are connected to the pin section 8 of the semiconductor integrated circuit 1 and coaxial cables 44 that connect the wiring patterns 43 and the test apparatus 41.

The test system 40 can test the interface section 7 in the same manner as in the second embodiment. In such tests as a function test and a DC test in which signals having various waveform patterns are exchanged, signal exchange between the test apparatus 41 and the semiconductor integrated circuit 1 can be performed without any intervention of the test assisting device 33. In such a test, it is possible to prevent the test assisting device 33 from influencing the signal exchange via the wiring patterns 43 and the coaxial cables 44 by establishing a high-impedance state in a connecting portion 33a, for connections to the semiconductor integrated circuit 1, of the test assisting device 33. That is, by changing the impedances of the connecting portion 33a, switching can be made as to whether to disconnect the first path.

As such, the test system according to the third embodiment can not only test the interface section 7 with high accuracy of timing by using the simple test assisting device 33 but also performs such tests as a function test and a DC test in which signals having various waveform patterns are exchanged.

The features and advantages of the present invention may be summarized as follows.

As described above, the present invention can provide a semiconductor integrated circuit that makes it possible to test an interface section with high accuracy of timing as well as a test system for performing such a test.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-009704, filed on Jan. 17, 2003 including specification, claims, drawings and summary, on which the Convention priority of the present application is based, are incorporated herein by reference in its entirety.

What is claimed is:

1. A semiconductor integrated circuit comprising:
   a pin section having a plurality of pins;
   internal circuits;
   an interface section for producing operation signals for causing operation of the internal circuits at the time of receiving signals from an external system via the pin section, and for outputting, to the external system, via the pin section, data that are read from the internal circuits;
   an expectation value generation circuit;
   a comparison circuit; and
   a waveform generation circuit;
   wherein, in a first test mode, the expectation value generation circuit generates expectation values of operation signals to be generated by the interface section when signals having the same waveform as each other are input as first test signals via respective pins of the pin section to the interface section, and the comparison circuit compares operation signals that are actually produced by the interface section with the respective expectation values and produces comparison results; and
   in a second test mode, the waveform generation circuit supplies second test signals to the interface section, and the interface section outputs test output signals having the same waveform to the external system via respective pins of the pin section.

2. The semiconductor integrated circuit according to claim 1, wherein the internal circuits are in a random operation mode in the first test mode and the second test mode, in which the internal circuits operate without the operation signals from the interface circuit.

3. A test system for testing the semiconductor integrated circuit according to claim 1, comprising:
   a test apparatus for producing the first test signals;
   a circuit board on which the semiconductor integrated circuit is mounted;
   a test assisting device provided in the vicinity of a mounting portion for the semiconductor integrated circuit;
   a first path that connects the test apparatus and the semiconductor integrated circuit via the test assisting device,
   wherein the test assisting device comprises:
   timing adjusting means for performing timing adjustments on the first test signals; and
   a comparative judgment circuit for performing comparative judgment on the test output signals.

4. The test system according to claim 3, further comprising a second path that connects the test apparatus and the semiconductor integrated circuit without any intervention of the test assisting device,
   wherein switching is made as to whether to disconnect the first path by changing impedances of a connecting portion, for connections to the semiconductor integrated circuit, of the test assisting device.

* * * * *